(12) United States Patent
O'Sullivan

(10) Patent No.: US 8,083,955 B2
(45) Date of Patent: Dec. 27, 2011

(54) SELECTIVE CHEMICAL ETCH METHOD FOR MRAM FREELAYERS

(75) Inventor: Eugene J. O'Sullivan, Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 578 days.

(21) Appl. No.: 12/245,255

(22) Filed: Oct. 3, 2008

(65) Prior Publication Data

US 2010/0087066 A1    Apr. 8, 2010

(51) Int. Cl.
*B44C 1/22* (2006.01)
(52) U.S. Cl. .......... 216/22; 216/100; 216/103; 438/738; 438/754
(58) Field of Classification Search ............ 216/22, 216/100, 103, 106; 438/738, 745, 754
See application file for complete search history.

(56) References Cited

U.S. PATENT DOCUMENTS

| | | | |
|---|---|---|---|
| 6,649,081 B1 * | 11/2003 | Johnson et al. | 252/79.1 |
| 7,252,774 B2 * | 8/2007 | O'Sullivan et al. | 216/22 |
| 7,368,299 B2 | 5/2008 | Lee et al. | |
| 2006/0289381 A1 | 12/2006 | O'Sullivan et al. | |
| 2007/0012656 A1 | 1/2007 | O'Sullivan et al. | |
| 2008/0210900 A1 * | 9/2008 | Wojtczak et al. | 252/79.3 |

OTHER PUBLICATIONS

International Search Report for International Application No. PCT/EP2009/058240; Mailing Date Sep. 14, 2009.

* cited by examiner

*Primary Examiner* — Lan Vinh
(74) *Attorney, Agent, or Firm* — Cantor Colburn LLP; Vazken Alexanian

(57) ABSTRACT

An etching process is employed to selectively pattern an exposed magnetic layer of a magnetic thin film structure. The etching process generally includes selectively patterning a magnetic film structure comprises providing a magnetic structure comprising at least one bottom magnetic layer, at least one top magnetic layer, wherein the at least one bottom magnetic layer is separated from the at least one top magnetic layer by a tunnel barrier layer; and selectively etching the top magnetic layer with an etching solution comprising at least one weakly absorbing acid, a surfactant inhibitor soluble in the at least one weakly absorbing acid, and at least one cation additive, wherein etching of the tunnel barrier layer is substantially prevented. In some embodiments, etching solution comprises at least one perfluoroalkane sulfonic acid, an alkylsulfonate salt soluble in the at least one perfluoroalkane sulfonic acid, and at least one cation additive.

22 Claims, 2 Drawing Sheets

SELECTIVE CHEMICAL ETCH METHOD FOR MRAM FREELAYERS

GOVERNMENT RIGHTS

This invention was made with Government support under Contract No. MDA972-99-C-0009 awarded by Defense Advanced Research Projects Agency (DARPA). The Government has certain rights in this invention.

BACKGROUND

The present disclosure generally relates to semiconductor devices, and more particularly to the fabrication of magnetic memory devices.

A recent development in semiconductor memory devices involves spin electronics, which combines semiconductor technology and magnetics. The spin of electrons, rather than the charge, is used to indicate the presence of a "1" or "0." One such spin electronic device is a magnetic random access memory (MRAM) device which includes conductive lines (wordlines and bitlines) positioned in a different direction, e.g., perpendicular to one another in different metal layers, the conductive lines sandwiching a magnetic stack or magnetic tunnel junction (MTJ), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1," is storable in the alignment of magnetic moments. The resistance of the magnetic memory cell depends on the moment's alignment. The stored state is read from the magnetic memory cell by detecting the component's resistive state.

An advantage of MRAM devices compared to traditional semiconductor memory devices such as dynamic random access memory (DRAM) devices is that MRAM devices are non-volatile. For example, a personal computer (PC) utilizing MRAM devices would not have a long "boot-up" time as with conventional PCs that utilize DRAM devices. Also, an MRAM device does not need to be powered up and has the capability of "remembering" the stored data. Therefore, it is expected that MRAM devices will replace flash memory, DRAM, and static random access memory devices (SRAM) devices in electronic applications where a memory device is needed.

Because MRAM devices operate differently than traditional memory devices, they introduce design and manufacturing challenges. The magnetic material layers used in MRAM devices require different etch chemistries and processes than traditional materials used in semiconductor processing, making them difficult to integrate into MRAM manufacturing processing schemes. For example, because of their small z-direction thickness, MTJ freelayers are expected to require gentler etching solutions than typical microelectronic back end of line processes or utilize thicker films to minimize lateral etching and to maximize etching selectivity with respect to thin tunneling barrier, which are commonly fabricated from a metal oxide such as $AlO_x$, and the like.

The simplest case of tunnel barrier dissolution may be written as:

$$R_{Tot} = R_H^+ + R_L$$

the linear combination of proton-promoted ($R_{H+}$) and anion/ligand-promoted ($R_L$) dissolution reactions, assuming these reactions are independent and parallel. Typically $R_L$ will depend not only on the surface concentration of ligand, but also on the type; for example, a 5- or 6-membered ring forming chelate will promote higher rates of metal oxide dissolution than one which forms chelate rings of fewer or more than 5 or 6. The simplest way to reduce $R_L$ to close to zero is to choose an acid with a non-surface interacting ligand, and to use pure solutions.

In the past, ultrapure perchloric acid $HClO_4$ has been the acid of choice where a non-adsorbing acid anion was used. However, due to safety considerations, $HClO_4$ has fallen out of favor; there is also the possibility of chloride contamination in $HClO_4$ solutions.

Accordingly, there is a need for improved etching processes for removing selected portions of the magnetic layer disposed on the tunnel barrier.

SUMMARY OF THE INVENTION

Disclosed herein are processes for etching a magnetic film structure. In one embodiment, the process for selectively patterning a magnetic film structure comprises providing a magnetic structure comprising at least one bottom magnetic layer, at least one top magnetic layer, wherein the at least one bottom magnetic layer is separated from the at least one top magnetic layer by a tunnel barrier layer; and selectively etching the top magnetic layer with an etching solution comprising at least one weakly absorbing acid, a surfactant inhibitor soluble in the at least one weakly absorbing acid, and at least one cation additive, wherein etching of the tunnel barrier layer is substantially prevented.

In another embodiment, the process comprises providing a magnetic structure comprising at least one bottom magnetic layer, at least one top magnetic layer, wherein the at least one bottom magnetic layer is separated from the at least one top magnetic layer by a tunnel barrier layer; and selectively etching the top magnetic layer with an etching solution comprising at least one perfluoroalkane sulfonic acid, an alkylsulfonate salt soluble in the at least one perfluoroalkane sulfonic acid, and at least one cation additive selected to replace bound protons on a surface of the tunnel barrier layer, wherein etching of the tunnel barrier layer is substantially prevented.

The disclosure may be understood more readily by reference to the following detailed description of the various features of the disclosure and the examples included therein.

BRIEF DESCRIPTION OF THE SEVERAL VIEWS OF THE DRAWINGS

Referring now to the figures wherein the like elements are numbered alike.

DETAILED DESCRIPTION

The present disclosure is generally directed to an etchant composition and process for selectively etching a magnetic layer disposed on a tunnel barrier layer The etchant composition increases the stability of the underlying tunnel barrier layer such that dissolution of the tunnel layer can be substantially prevented. The etchant composition generally includes at least one weakly adsorbing acid, a surfactant inhibitor soluble in the at least one weakly absorbing acid, and at least one cation additive.

Figure 1:
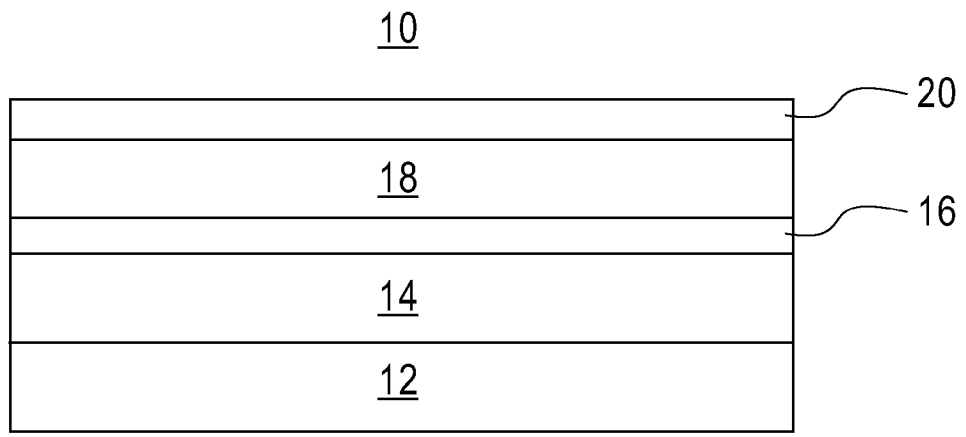
FIG. 1 illustrates a cross sectional view of an exemplary MRAM structure.

For illustrative purposes, an exemplary MRAM structure 10 is shown in FIG. 1. Specifically, the MRAM structure 10 generally includes a bottom magnetic layer 14, a tunnel barrier layer 16, a top magnetic layer 18, and a passivation layer 20, all of which are disposed on a substrate 12, typically silicon. The structure may further include additional layers such as adhesion layers, barrier layers, and the like. The top and bottom magnetic layers may be composed of the same or different magnetic layers in which each individual layer generally has a thickness of less than 150 Å. It should be noted that the top and/or bottom magnetic layers 14, 18 may comprise only one magnetic film or they may comprise a stack of magnetic films. In one embodiment, each individual magnetic film layer has a thickness of less than 100 Å.

Illustrative examples of magnetic materials that can be employed for the magnetic layers 14, 18 include, but are not intended to be limited to, $Ni_xFe_y$, $Ni_xCo_yFe_z$, and other like magnetic materials. In the above formulas, x, y, and z are any integers whose sum adds up to 100.

In one embodiment, the top magnetic layer 14 is comprised of a Permalloy layer, i.e., a $Ni_xFe_y$ type, or $Co_xFe_y$ layer, while the bottom magnetic film layer 18 comprises a stack including $Ni_xFe_y$ and $Co_xFe_y$.

The tunnel barrier layer 16 includes any conventional material such as $Al_2O_3$, which is capable of sustaining a tunneling current and which does not chemically degrade the properties of the top and bottom magnetic layers (14 and 18, respectively). In some instances, the tunnel barrier layer 16 may also serve as a diffusion barrier. The tunnel barrier layer 16 is generally a thin layer, which has a thickness of less than about 15 Å.

The passivating layer 20 includes any metal layer such as, for example, Ti, TiN, Ta, or TaN which serves as a barrier layer preventing diffusion of moisture, air, and other contaminants from contacting the underlying magnetic layers 14, 18 and the tunnel barrier layer 16. The thickness of the passivation layer may vary, but typically has a thickness of from about 20 to about 1000 Å. The passivating layer 20 may contain a surface oxide, which is located on the upper surface of the passivating layer 20 when the structure is exposed to air.

The processes for fabricating the MRAM structure include a number of conventional techniques. For example, the various magnetic and non-magnetic layers can be formed using chemical vapor deposition (CVD), plasma assisted CVD, plating, evaporation, sputtering, chemical solution deposition, or the like. The various magnetic and non-magnetic layers can be patterned using well known lithographic techniques. During the fabrication process, selected portions of the top magnetic layer are exposed such that a selective etching process is needed to remove the exposed portions of the magnetic layer so as to give the MRAM structure its desired structural characteristics. The exposed portions of the top magnetic layer are etched using an etchant solution having the etchant composition as generally described above.

The etchant composition generally includes at least one weakly absorbing acid, a surfactant inhibitor soluble in the at least one weakly absorbing acid, and at least one cation additive. In one embodiment, the at least one weakly absorbing acid is a perfluoroalkane sulfonic acid. By "a perfluoroalkane sulfonic acid" it is meant a sulfonic acid derivative that is substituted with a perfluoroalkyl group. By "a perfluoroalkyl" it is meant an alkyl in which all hydrogen atoms have been replaced by fluorine. Suitable perfluoroalkane sulfonic acids employed are $CF_3(CF_2)_nSO_3H$ or $(CF_2)_m(SO_3H)_2$, wherein n can be zero or any integer from 1 to 6, m can be any integer from 1 to 6. Illustrative examples of perfluoroalkane sulfonic acids that can be used include, but are not limited to: $CF_3SO_3H$; $CF_3CF_2SO_3H$; $CF_2(SO_3H)_2$; $(CF_2)_2(SO_3H)_2$; and other analogous perfluoroalkane sulfonic acids with perfluoroalkyl chains having more than two carbon atoms. Other suitable perfluoroalkane sulfonic acids include analogs of the above illustrative examples wherein at least one of the F atom are substituted by—$NH_2$. In one embodiment, the perfluoroalkane sulfonic acid is trifluoromethane sulfonic acid (TFMSA). Due to the high electron-withdrawing tendency of the electronegative F atoms, TFMSA is one of the strongest acids (pKa=ca.–13), and is essentially fully dissociated in aqueous solutions. Electrochemical and X-ray Absorption Near Edge Structure (XANES) studies have revealed a negligible tendency for TFMSA anion adsorption on noble metal surfaces. It is expected that TFMSA anion will similarly exhibit a negligible tendency for interacting with oxide surfaces, such as engaging in metal ion complexation reactions, e.g., with $Al^{+3}$ or related partially-hydrolyzed $Al^{+3}$ species, i.e., $R_L$ is essentially zero for this anion.

The surfactant inhibitor is selected to be soluble in the at least one weakly absorbing acid, e.g., soluble in the perfluoroalkane sulfonic acid. The term "surfactant inhibitor" is used herein to denote a substance that, when present at a low concentration, adsorbs onto the surface of a solution or the interfaces of a multi-phase solution system, and substantially alters the free energy of the surface or the interfaces. The term "interface" is used herein to denote a surface forming a common boundary between any two immiscible phases. In one embodiment, the surfactant inhibitors are alkylsulfonic acid salts, also referred to herein as alkane sulfonates. By "alkylsulfonic acid salts or alkane sulfonates" it is meant to include any metal salt of a sulfonic acid derivative that is substituted with an alkyl group. By "alkyl" it is meant an acyclic alkyl that has more than 7 carbon atoms to less than 16 carbon atoms. Illustrative examples of surfactant inhibitors that can be employed in the present disclosure include, but are not limited to: $CH_3(CH_2)_hSO_3M$; and other analogous compounds; wherein M may be any metal cation, such as a sodium or potassium cation, and h can be any integer from 6 to 15. It is understood to one skilled in the art that the alkyl chain of the above illustrative examples can be straight or branched. Since the pH of zero charge (PZC) of bulk alumina is close to 9, the PCZ of the tunnel barrier 16 should be significantly greater than the pH of the etchant solutions. It is believed that the negatively charged $SO_3^-$ group of the alkylsulfonic acid salts adsorbs on the positively charged sites on the tunnel barrier surface thereby protecting the tunnel barrier 16 from dissolution, or significantly slowing such dissolution. As a general rule, the longer the chain length of the surfactant inhibitor, the greater is the thermodynamic tendency for the surfactant inhibitor to come out of solution and adsorb on surfaces. That is, the $AlO_x$ etch inhibitor ability of the alkane sulfonate surface active compounds is proportional to molecular weight: $CH_3(CH_2)_9SO_3^-Na_+ < CH_3(CH_2)_{11}SO_3^-Na+ < CH_3(CH_2)_{13}SO_3^-Na_+ < CH_3(CH_2)_{15}SO_3^-Na_+$. Though an excellent $AlO_x$ etch inhibitor in a trifluoromethane sulfonic acid solution, the low solubility of the $CH_3(CH_2)_{15}SO_3^-Na_+$ (SHS) can make the etchant solution more difficult to use, e.g., it takes overnight to dissolve in aqueous solution at room temperature. As will be discussed in greater detail below, Applicant has discovered that more soluble alkane sulfonic acid salts, that are generally less effective than the longer alkyl chain derivatives, can be made more effective to prevent tunnel layer dissolution through the use of at least one cation additive within the etchant composition.

Exemplary alkylsulfonates along with its corresponding critical micelle point are provided in Table 1 below.

TABLE 1

| Name | Chemical Formula | Critical Micelle Point |
|---|---|---|
| Sodium 1-decanesulfonate | $CH_3(CH2)_9SO_3^-Na^+$ | $4.5 \times 10^{-2}$ M (25° C.) |
| Sodium 1-dodecanesulfonate | $CH_3(CH2)_{11}SO_3^-Na^+$ | $1.2 \times 10^{-2}$ M (40° C.) |
| Sodium 1-tetradecanesulfonate | $CH_3(CH_2)_{13}SO_3^-Na^+$ | $2.5 \times 10^{-3}$ M (40° C.) |
| Sodium 1-hexadecanesulfonate | $CH_3(CH2)_{15}SO_3^-Na^+$ | $7.0 \times 10^{-4}$ M (50° C.) |

These surface active inhibitors are characterized by a) having a hydrophobic tail (normally called the lyophobic group) which possess little attraction for bulk aqueous solution, and b) functional groups called lyophilic groups (hydrophilic) which have a strong attraction for the bulk aqueous phase. The lyophobic group causes distortion of the aqueous solution structure, and increases the overall free energy of the system, and results in less work being required to transport such a molecule to a surface or interface. Driven by factors such as poor solubility the surface active molecule tends to adsorb or concentrate at such locations, or it may undergo other processes to lower the energy of the system, such as micelle formation. Micelle formation is a process in which individual molecules in solution aggregate into clusters, averaging 25-200 molecules, and which are sometimes spherically shaped. This occurs in such a way that the hydrophobic parts of the molecules are closely associated with one another, and are largely protected from extensive contact with the bulk of the aqueous phase. The micelle formation phenomena tend to occur at a well-defined concentration of the surface active compound; the concentrations for the sulfonates of interest to the present work are listed in Table 1. The concentrations of all inhibitor solutions used in the present study were generally about 5-10 times smaller that the CMC value.

Figure 2:
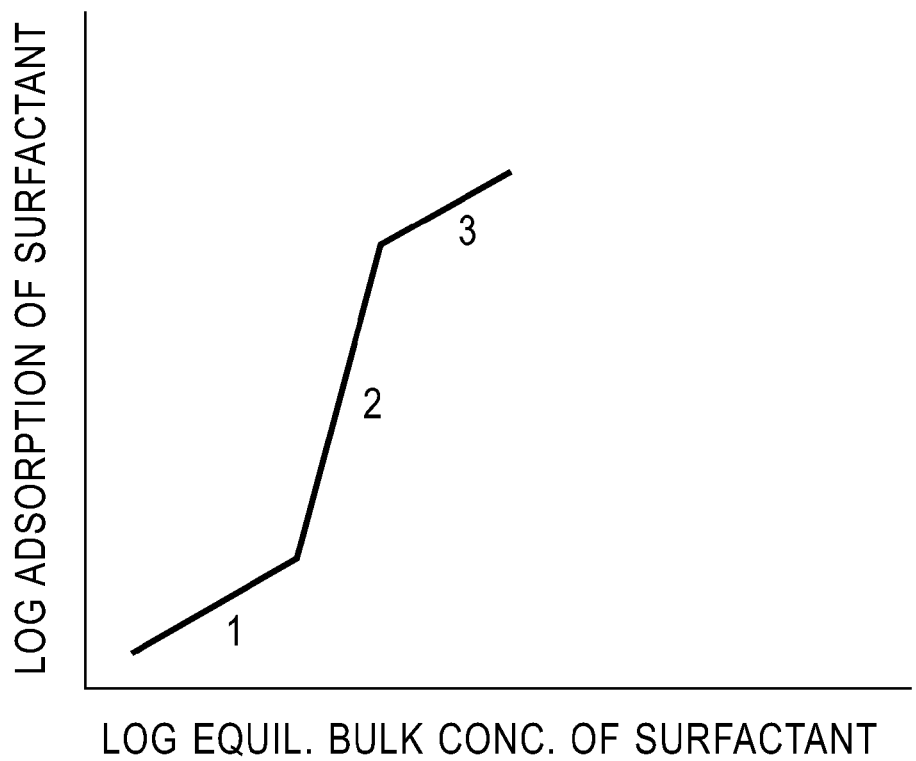
FIG. 2 graphically illustrates log adsorption of surfactant as a function of log equilibrium bulk concentration of surfactant.

FIG. 2 shows a typical S-shaped adsorption isotherm for a surface active material. The isotherm has distinct regions labeled 1, 2, 3, which may be associated with different stages in the surfactant adsorption process as described in the figure caption. Region 1 primarily involves replacement of any counter-ions adsorbed on the surface by similarly-charged surface active ions; no significant net change in surface charge (or surface potential) occurs in this stage. Region 2 involves adsorption of surface active ions onto oppositely-charged surface sites not occupied by counter-ions; the net surface charge decreases in this stage. As progress in adsorption of surface active species leads to complete neutralization of the surface, the surface will go though its point of zero charge (pzc); in the latter state all the surface charged species will have been paired by adsorbed surface active ions (i.e., region 3).

The driving force for the ability of surface active species (i.e. surfactants) to displace similarly charged simple inorganic ions from the surfaces of solids by an ion exchange mechanism is believed to be due in part to van der Waals dispersion forces. These latter forces increase with increase in molecular weight of the adsorbate, or adsorbing species; hence the well known phenomenon of increase in surface activity with hydrophobic chain length for surfactants. The hydrophobic tails of the surfactant molecules are generally perpendicular, inclined at an angle to the surface, or in some instances, may lie flat on the surface.

The at least one cation additive is selected from the group consisting of $Al^{+3}$, $Fe^{+3}$, and combinations comprising at least one of the foregoing cations. Other examples include $Gd^{+3}$, $Cr^{+3}$, $Ce^{+3}$, $Ga^{+3}$, $La^{+3}$, and $Sm^{+3}$. The at least one cation additive is introduced into the etchant composition as a soluble salt, wherein the anion portion is not intended to be limited to any particular anion so long as the anion is substantially inert to the MRAM structure as well as the etchant composition. By way of example, the $Al^{+3}$ cation can be introduced with a $Al(CF_3SO_3)_3$ solution and the Fe cation can be introduced with a $Fe_3(NO_3)_3$ solution.

The mechanism of metal ion adsorption on hydrous (hydrated) oxide surfaces involves an ion exchange process in which the adsorbing metal ions replace bound protons as shown in the following simplified reaction scheme:

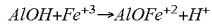

$$AlOH + Fe^{+3} \rightarrow AlOFe^{+2} + H^+$$

In practice the $Fe^{+3}$ ion will exist in solution as the hexaquo ion or a hydrolyzed variant if the solution pH is not low enough; similarly $H_2O$ molecules tend to occupy available coordination positions on the surface adsorbed metal ion. The released protons may undergo readsorption on the alumina surface through either ion pair formation or protonation of aluminol (AlOH) groups as shown above or remain in solution. In this manner, positive charge density is increased on the tunneling barrier $AlO_x$ surface through metal cation adsorption, and thus more sites are generated for anionic surfactant adsorption. This charge-based, largely ion-pairing based adsorption mechanism is likely to be more applicable to lower molecular weight surfactants, for which van der Waals forces are less important as a driving force for adsorption. As such, the addition of the at least one cation additive to the etchant composition provides a means to be able to use the shorter-chain (albeit less effective inhibitors by themselves), and thus, more soluble alkane sulfonate surfactants.

The etchant solution typically comprises the surfactant inhibitor at a concentration of at least about $5 \times 10^{-6}$ molar, with a preferred concentration being dependent on the solubility of the surfactant inhibitor. For example, the preferred concentration for sodium tetradecanesulfonate is from about $2 \times 10^{-5}$ to about $10^{-4}$ molar. The perfluoroalkyl sulfonic acid is at a concentration of from about $10^{-3}$ molar to about 1.0 molar, with a concentration from about $5 \times 10^{-3}$ molar to about $5 \times 10^{-2}$ molar being more preferred. The at least one cation additive is at a concentration of about $5 \times 10^{-4}$ to about $5 \times 10^{-2}$ molar.

While not wanting to be bound by theory, it is believed that the ferromagnetic freelayers (e.g., magnetic layer 14) undergo dissolution in trifluoromethane sulfonic acid solution via oxidation of the metal and its dissolution as hydrated metal ions (e.g. $[Ni(H_2O)_6]^{+2}$, possibly with partial hydrolysis, or deprotonation of $H_2O$ molecules, if the solution pH is high enough) as the anodic reaction(s), enabled by the reduction of protons, along with the reduction of dissolved $O_2$ gas when the latter is present, as the cathodic reaction(s). On removal of the MRAM MTJ freelayer by etching in acidic solution, rapid development of $AlO_x$ tunneling barrier surface charge occurs due to hydration of the surface and protonation of surface oxide ions. A possible method of slowing the rate of dissolution of $AlO_x$ at the conclusion of freelayer etching is to utilize the net positive charge present on the $AlO_x$ surface for adsorption of the alkyl sulfonate anionic inhibitors as described above to protect potentially active sites from dissolution. Sulfonates were chosen rather than the analogous sulfates due to the greater resistance to hydrolysis of the sulfonate class.

The etching step is typically carried out at a temperature of about 15° C. to about 50° C. for a period of time from about 0.5 to about 15 minutes, depending on the source and type of parts, the condition of the free top layer surface, and the thickness of the top magnetic layer 18. More preferably, the etching step is carried out at a temperature of about 20° C. to about 35° C.

The following examples are presented for illustrative purposes only, and are not intended to limit the scope of the invention.

EXAMPLE 1

Figure 3:
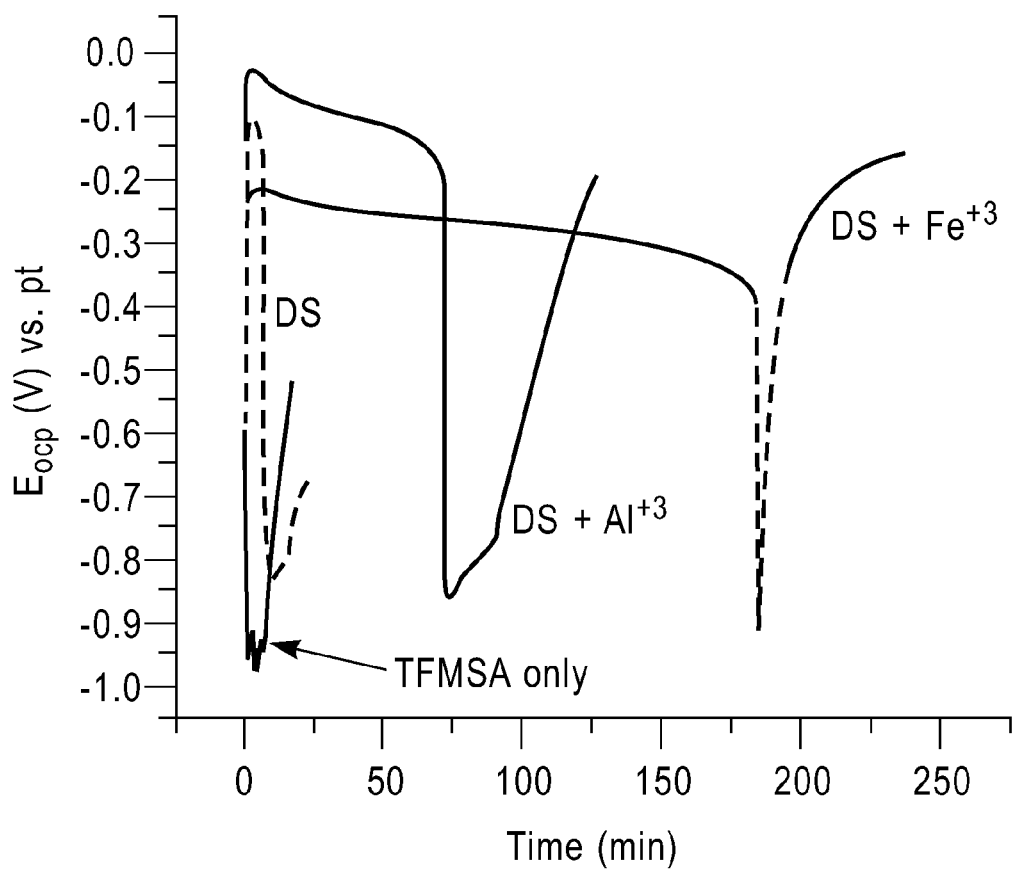
FIG. 3 graphically illustrates open circuit potential behavior as a function of time for a film stack including an aluminum oxide tunnel layer in various etchant solutions containing trifluoromethane sulfonic acid.

In this example, open circuit potential behavior was studied for a film stack including a silicon substrate, 1000 Å of $SiO_2$, 50 Å of tantalum, 50 Å of Co—Fe; 9 Å of AlOx in etching solutions containing $2\times10^{-2}$ M trifluoromethane sulfonic acid with and without various additives. The etching solutions included (a) $2\times10^{-2}$ M trifluoromethane sulfonic acid by itself; (b) $2\times10^{-2}$ M trifluoromethane sulfonic acid and $1\times10^{-3}$ M decanesulfonate (DS); (c) $2\times10^{-2}$ M trifluoromethane sulfonic acid, $1\times10^{-3}$ M decanesulfonate, and $5\times10^{-3}$ M $Al(CF_3SO_3)_3$; and (d) $2\times10^{-2}$ M trifluoromethane sulfonic acid, $1\times10^{-3}$ M decanesulfonate, and $5\times10^{-3}$ M $Fe(NO_3)_3$. The results are shown in FIG. 3, wherein trifluoromethane sulfonic acid is labeled TFMSA, and decanesulfonate is labeled DS.

Advantageously, the use of the highly soluble $CH_3(CH_2)_9SO_3^-Na_+$ decanesulfonate inhibitor provided improved ease in etchant solution preparation since the etchant solution could be made immediately prior to the etching process. Moreover, the open circuit potential behavior of the model film stack 50 Å Ta|50 Å Co—Fe|9 Å Al(Ox) in $2\times10_{-2}$M TFMSA solution only showed that the sample AlOx and Co—Fe layers etched rapidly within a few minutes in pure TFMSA solution. In the presence of DS inhibitor, the etch resistance of the $AlO_x$ was improved by a factor of about 2 to 3. However, the addition of $Al^{+3}$ and $Fe^{+3}$ cations to the TFMSA+DS solution dramatically increased the stability of the $AlO_x$, with final etching of the underlying Co—Fe layer occurring after approximately 60 minutes in the case of the $Al^{+3}$ cation additive, and after approximately 160 minutes in the case of the $Fe^{+3}$ cation. Thus, the present disclosure shows it is possible to use the more soluble member of the sulfonate family as an inhibitor for arresting $AlO_x$ tunneling barrier dissolution in the solution used for etching the soft magnetic layer.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A process for selectively patterning a magnetic film structure, comprising:
providing a magnetic structure comprising at least one bottom magnetic layer, at least one top magnetic layer, wherein the at least one bottom magnetic layer is separated from the at least one top magnetic layer by a tunnel barrier layer; and
selectively etching the top magnetic layer with an etching solution comprising at least one weakly absorbing acid, a surfactant inhibitor soluble in the at least one weakly absorbing acid, and at least one cation additive, wherein etching of the tunnel barrier layer is substantially prevented.

2. The process of claim 1, wherein the tunnel barrier layer is $Al_2O_3$.

3. The process of claim 1, wherein the at least one cation additive is $Al^{+3}$ and/or $Fe^{+3}$.

4. The process of claim 1, wherein said at least one top magnetic film layer and said at least one bottom magnetic film layer are the same or different, and are $Ni_xFe_y$, $Ni_xCO_yFe_z$, wherein x, y and z are any integers whose sum adds up to 100.

5. The process of claim 1, wherein said at least one top magnetic layer is $Ni_xFe_y$, and the at least one bottom magnetic film layer is a stack comprising $Ni_xFe_y$ and $Co_xFe_y$.

6. The process of claim 1, wherein each one of the at least one top and bottom magnetic layers has a thickness of less than 150 Å.

7. The process of claim 1, wherein said surfactant inhibitor employed is an alkylsulfonic acid salt.

8. The process of claim 1, wherein said surfactant inhibitor employed is $CH_3(CH_2)_hSO_3^-Na^+$, wherein h is an integer from 6 to 14.

9. The process of claim 1, wherein the concentration of said surfactant inhibitor is at least about $5\times10^{-6}$ molar.

10. The process of claim 1, wherein etching is at a temperature from about 15° C. to about 50° C. for a time period from about 0.5 to about 15 minutes.

11. The process of claim 1, wherein the at least one weakly adsorbing acid employed is perfluoroalkane sulfonic acid.

12. The process of claim 1, wherein the at least one weakly adsorbing acid employed is trifluoromethane sulfonic acid.

13. The process of claim 1, wherein the concentration of said perfluoroalkane sulfonic acid is from about $10^{-3}$ molar to about 1.0 molar.

14. The process of claim 1, wherein the concentration of said perfluoroalkane sulfonic acid is from about $5\times10^{-3}$ molar to about $5\times10^{-2}$ molar.

15. The process of claim 1, wherein the at least one weakly absorbing acid is of a formula $CF_3(CF_2)_nSO_3H$ or $(CF_2)_m(SO_3H)_2$, wherein n can be zero or any integer from 1 to 6, m can be any integer from 1 to 6, and the F atom can be optionally substituted by —$NH_2$.

16. The process of claim 1, wherein the at least one cation additive is selected from the group consisting of $Al^{+3}$, $Fe^{+3}$, $Gd^{+3}$, $Cr^{+3}$, $Ce^{+3}$, $Ga^{+3}$, $La^{+3}$, $Sm^{+3}$ and combinations comprising at least one of the foregoing cations.

17. A process for selectively patterning a magnetic film structure, comprising:
providing a magnetic structure comprising at least one bottom magnetic layer, at least one top magnetic layer, wherein the at least one bottom magnetic layer is separated from the at least one top magnetic layer by a tunnel barrier layer; and
selectively etching the top magnetic layer with an etching solution comprising at least one perfluoroalkane sulfonic acid, an alkylsulfonate salt soluble in the at least one perfluoroalkane sulfonic acid, and at least one cation additive selected to replace bound protons on a surface of the tunnel barrier layer, wherein etching of the tunnel barrier layer is substantially prevented.

18. The process of claim 17, wherein the tunnel barrier layer is an aluminum oxide.

19. The process of claim 17, wherein the at least one top magnetic film layer and the at least one bottom magnetic film layer are the same or different, and are $Ni_xFe_y$, $Ni_xCO_yFe_z$, wherein x, y and z are any integers whose sum adds up to 100.

20. The process of claim 17, wherein the perfluoroalkane sulfonic acid is of a formula $CF_3(CF_2)_nSO_3H$ or $(CF_2)_m(SO_3H)_2$, wherein n can be zero or any integer from 1 to 6, m can be any integer from 1 to 6, and the F atom can be optionally substituted by —$NH_2$.

21. The process of claim 17, wherein the alkylsulfonate salt soluble in the at least one perfluoroalkane sulfonic acid is of a formula $CH_3(CH_2)_hSO_3^-M^+$, wherein h is an integer from 6 to 14.

22. The process of claim 17, wherein the at least one cation additive is selected from the group consisting of $Al^{+3}$, $Fe^{+3}$, $Gd^{+3}$, $Cr^{+3}$, $Ce^{+3}$, $Ga^{+3}$, $La^{+3}$, $Sm^{+3}$ and combinations comprising at least one of the foregoing cations.

* * * * *